(12) United States Patent
Lee et al.

(10) Patent No.: US 7,910,999 B2
(45) Date of Patent: Mar. 22, 2011

(54) METHOD FOR FOUR DIRECTION LOW CAPACITANCE ESD PROTECTION

(75) Inventors: Jian-Hsing Lee, Hsin-Chu (TW); Shui-Hunyi Chen, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 176 days.

(21) Appl. No.: 12/342,294

(22) Filed: Dec. 23, 2008

(65) Prior Publication Data

US 2009/0101937 A1      Apr. 23, 2009

Related U.S. Application Data

(62) Division of application No. 11/622,574, filed on Jan. 12, 2007, now Pat. No. 7,485,930, which is a division of application No. 10/207,545, filed on Jul. 29, 2002, now Pat. No. 7,179,691.

(51) Int. Cl.
*H01L 23/62* (2006.01)

(52) U.S. Cl. .................. 257/355; 257/E29.024

(58) Field of Classification Search .................. 257/127, 257/173, 355, 356, 357, 358, 359, 360, 361, 257/362, 363, E29.024, E29.025, E29.026
See application file for complete search history.

(56) References Cited

U.S. PATENT DOCUMENTS

| | | | | |
|---|---|---|---|---|
| 3,899,373 A | * | 8/1975 | Antipov | 438/586 |
| 4,033,787 A | * | 7/1977 | Marshall | 438/53 |
| 4,490,192 A | * | 12/1984 | Gupta et al. | 438/558 |
| 4,722,910 A | * | 2/1988 | Yasaitis | 438/297 |
| 4,772,910 A | | 9/1988 | Fields | |
| 4,959,708 A | | 9/1990 | Henderson et al. | |
| 5,494,857 A | * | 2/1996 | Cooperman et al. | 438/437 |
| 5,571,737 A | | 11/1996 | Sheu et al. | |
| 5,637,900 A | | 6/1997 | Ker et al. | |
| 5,714,784 A | | 2/1998 | Ker et al. | |
| 5,763,918 A | | 6/1998 | El-Kareh et al. | |
| 5,852,315 A | | 12/1998 | Ker et al. | |
| 5,895,940 A | * | 4/1999 | Kim | 257/173 |
| 5,905,289 A | | 5/1999 | Lee | |
| 6,008,108 A | | 12/1999 | Huang et al. | |
| 6,049,119 A | | 4/2000 | Smith | |
| 6,097,066 A | | 8/2000 | Lee et al. | |
| 6,249,413 B1 | | 6/2001 | Duvvury | |
| 6,329,694 B1 | | 12/2001 | Lee et al. | |
| 6,417,544 B1 | | 7/2002 | Jun et al. | |
| 6,424,013 B1 | | 7/2002 | Steinhoff et al. | |

(Continued)

OTHER PUBLICATIONS

Wolf, "Silicon Processing for the VLSI Era, vol. 2—Process Integration," 1990, Lattice Press, p. 12-13.*

(Continued)

*Primary Examiner* — Minh-Loan T Tran
*Assistant Examiner* — Kevin Quinto
(74) *Attorney, Agent, or Firm* — Thomas | Kayden (57) ABSTRACT

The invention describes a structure and a process for providing ESD semiconductor protection with reduced input capacitance. The structure consists of heavily doped P+ guard rings surrounding the I/O ESD protection device and the Vcc to Bss protection device. In addition, there is a heavily doped N+ guard ring surrounding the I/O protection device its P+ guard ring. The guard rings enhance structure diode elements providing enhanced ESD energy discharge path capability enabling the elimination of a specific conventional Vss to I/O pad ESD protection device. This reduces the capacitance seen by the I/O circuit while still providing adequate ESD protection for the active circuit devices.

14 Claims, 6 Drawing Sheets

U.S. PATENT DOCUMENTS

| | | |
|---|---|---|
| 6,605,493 B1 | 8/2003 | Yu |
| 6,621,133 B1 | 9/2003 | Chen et al. |
| 6,628,493 B1 | 9/2003 | Chen et al. |
| 6,639,283 B1 | 10/2003 | Hung et al. |
| 6,720,622 B1 | 4/2004 | Yu |
| 2002/0055214 A1* | 5/2002 | Trivedi .......................... 438/200 |
| 2002/0167091 A1* | 11/2002 | Iwasaki et al. ................ 257/765 |
| 2003/0197225 A1 | 10/2003 | Chen et al. |
| 2003/0197226 A1 | 10/2003 | Chen et al. |

OTHER PUBLICATIONS

Wolf, "Silicon Process for the VLSI Era, vol. 2—Process Integration," 1990, Lattice Press, p. 12-13.

* cited by examiner

FIG. 6

METHOD FOR FOUR DIRECTION LOW CAPACITANCE ESD PROTECTION

CROSS REFERENCE TO RELATED APPLICATIONS

This application is a divisional of U.S. patent application Ser. No. 11/622,574, filed Jan. 12, 2007, which is a division of U.S. Pat. No. 7,179,691, issued Feb. 20, 2007, and entitled "A NOVEL METHOD FOR FOUR DIRECTION LOW CAPACITANCE ESD PROTECTION".

BACKGROUND OF THE INVENTION

1. Field of the Invention

The present invention relates generally to the structure and manufacturing process of a FET semiconductor device for ESD protection of electronic circuit devices and more particularly to a structure with a guard ring for low capacitance input ESD protection.

2. Description of Prior Art

Because of high input impedance and thin oxide gate structures, the problem of electrostatic discharge damage (ESD) with field effect transistor (FET) devices can be severe. Therefore the input/output (I/O) circuit locations or pads usually have a protective device connected between the I/O pad and the internal circuits which allows the ESD current to be shunted to an alternative voltage source, typically ground, protecting the active internal circuits from damage.

There can be several different types of device structures used for these protective devices, such as single diodes, stacked diodes, field effect transistor (FET) devices, and silicon controlled rectifiers (SCR).

Figure 1A:
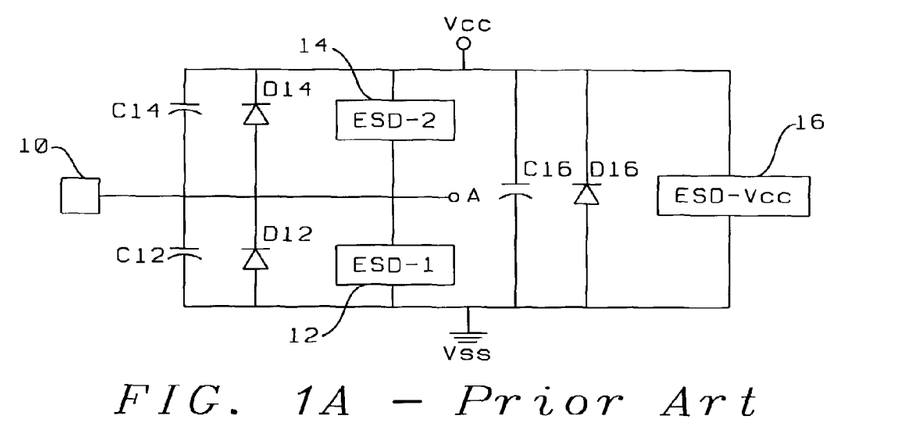
FIG. 1A shows a simplified schematic of prior art ESD protection scheme.

With prior art devices, the capacitance associated with the ESD protection device on the active circuit input pad could be a concern as circuit speeds increase. A typical prior art protection circuit scheme is represented in FIG. 1A. The active circuit input-output (I/O) terminal or pad 10 is connected to the ESD protection circuit devices ESD-1 element 12 with associated parasitic capacitance C12 and parasitic diode D12, and protection device ESD-2 element 14 with associated parasitic capacitance C14 and parasitic diode D14. The I/O pad 10 is also connected to the input or output stage of the active logic circuits A. Also shown in FIG. 1 is the protection devices ESD-Vcc element 16 with associated parasitic capacitance 16 and parasitic diode D16 that protects against high ESD voltages occurring on the circuit power lines Vcc and Vss.

A positive ESD voltage at the input pad 10 would turn on diode D14 and ESD-1 12 providing a suitable discharge path for the ESD energy. For a negative ESD event on the I/O pad 10, diode D 12 is placed into a conducting mode, as is ESD-Vcc 16, again providing a suitable discharge path for the ESD energy.

Figure 1B:
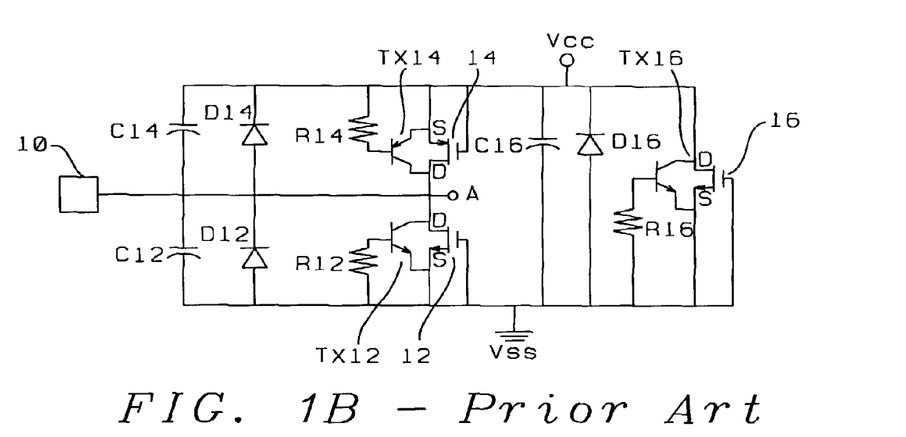
FIG. 1B shows a detailed schematic for typical prior art device configuration for ESD protection.
Figure 1C:
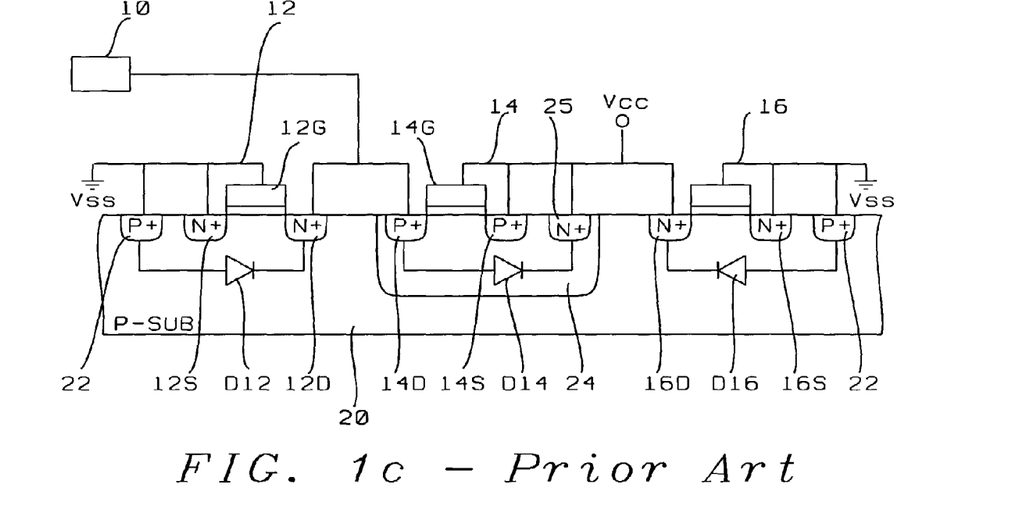
FIG. 1C shows a typical vertical cross section for prior art ESD protection scheme.

Typical prior art protection devices are shown in schematic form in FIG. 1B. Protection device ESD-1 is shown as a N channel metal oxide semiconductor (NMOS) 12, and ESD protection device ESD-2 is shown as a P channel MOS (PMOS) 14. The ESD-Vcc protection device is shown as a NMOS device 16. FIG. 1C shows a representative cross-section of the ESD protection circuit devices. NFET 12 has its source 12 S connected to its gate 12G and to the Substrate 20 P+ contact 22 and to a second voltage source Vss, typically ground. The NMOS 12 drain D12 is connected to the ESD-2 PMOS protection device 14 drain 14D. The gate 14G of ESD-2 PMOS protection device 14 is connected to its source element 14S and to the source 16S of ESD-VCC NMOS protection device 16 and subsequently to a first voltage source Vcc.

Although the prior art circuit shown in FIG. 1B provides ESD protection for the active devices, the stray or parasitic capacitance C12 and C13 impose undesired capacitive loading to the I/O pad and logic circuit input stage A.

The invention provides a unique structure and method to eliminate some of this capacitance on the I/O pad while still providing appropriate ESD protection.

The following patents and reports pertain to ESD protection.

U.S. Pat. No. 6,097,066 (Lee et al.) shows an ESD structure with a third ring shape serving as a guard ring.

U.S. Pat. No. 5,714,784 (Ker et al.) reveals an ESD structure with guard rings.

U.S. Pat. No. 5,637,900 (Ker et al.) shows an ESD structure with P+ guard rings.

U.S. Pat. No. 6,249,413 (Duvvury) and U.S. Pat. No. 5,905,287 (Hirata) show related ESD structures and guard rings.

SUMMARY OF THE INVENTION

Accordingly, it is the primary objective of the invention to provide an effective and manufacturable method and structure for reducing the capacitance of the protective device providing resistance to the potential damage caused by the phenomenon known as electrostatic discharge (ESD) by utilizing a low capacitance ESD protection device connected to an input pad of an integrated circuit device.

It is a further objective of the invention to improve ESD protection for high frequency applications by providing a low input capacitance structure that will have minimum impact on device performance while maintaining reasonable ESD protection levels.

A still additional objective of the invention is to provide the ESD protection with reduced capacitance without changing the characteristics of the internal circuits being protected and by using a process compatible with the process of integrated MOS device manufacturing.

The above objectives are achieved in accordance with the methods of the invention that describes a structure and a manufacturing process for semiconductor ESD protection devices with reduced input capacitance. One embodiment of the invention utilizes a NMOS FET structure with associated junction diode and parasitic NPN bipolar transistor for ESD protection for both positive and negative ESD voltages occurring on the active circuit input pad. There is a heavily doped P+ guard ring that protects the NMOS device from exhibiting latchup characteristics. The guard ring also enhances the junction diode characteristics improving ESD protection for negative ESD voltages on the input pad. A heavily doped N+ guard ring surrounding the NMOS device including the P+ guard ring enhances the Vcc to Vss ESD protection diode characteristics, and eliminates the need for an additional device, often referred to as ESD2, to protect against this mode of ESD occurrence, which would normally be attached from the input pad to Vcc. This design structure eliminates the capacitance associated with the prior art devices that have a second ESD protection device from the input pad to Vcc.

DESCRIPTION OF THE PREFERRED EMBODIMENTS

Figure 2A:
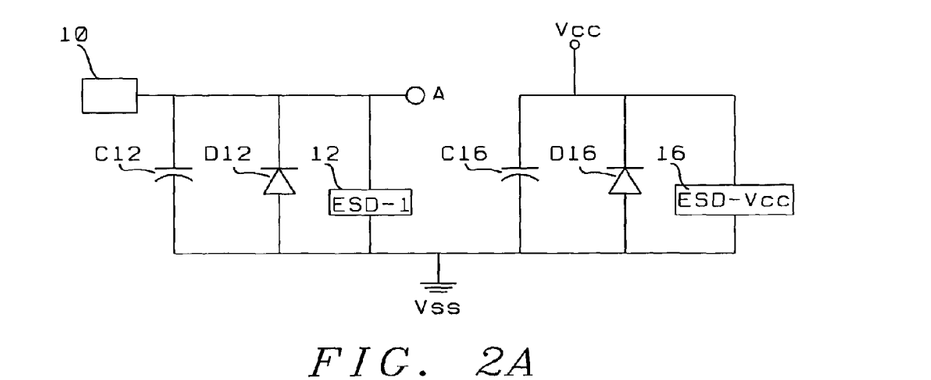
FIG. 2A is a simplified schematic representation of the principle elements of the invention ESD protection device.

FIG. 2A shows a simplified representation of the principle advantage of the invention. As shown in FIG. 2A, the input pad 10 is protected from ESD incidents by the protection devices ESD-1 element 12. The invention embodiment details are sufficient to protect the input circuit from both positive and negative ESD voltage events. In addition, the embodiment of the invention also protects against positive and negative ESD voltages that may occur on the Vcc and or on the Vss power bus.

Figure 2B:
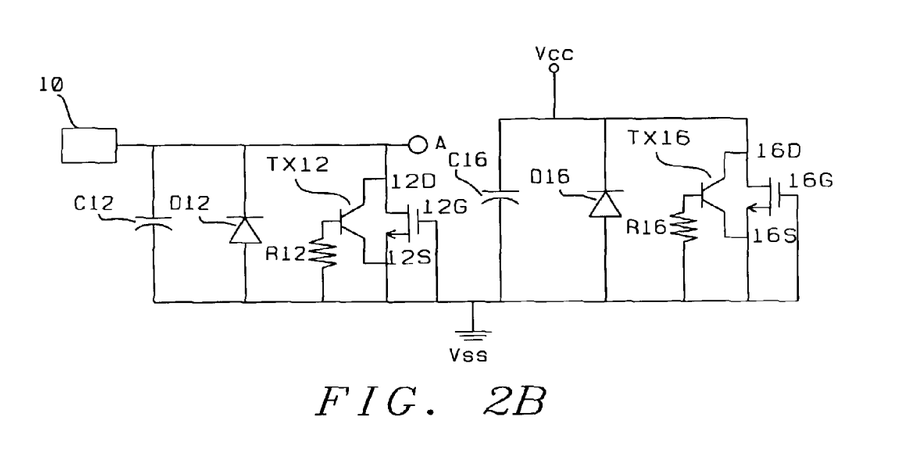
FIG. 2B is a schematic for one embodiment of the invention ESD protection scheme.

FIG. 2B shows typical device schematic devices for a NMOS device 12 used for the protective devices ESD-1. The NMOS 12 drain 12D is connected to the input pad 10, and the source 12S and gate 12G are connected to a second voltage source Vss, typically ground. Shown electrically in parallel with ESD-1 NMOS device 12 are the parasitic elements diode D12 and capacitor C12 connected between the input pad 10 and the second voltage source, Vss. Also shown in FIG. 2B is the bipolar NPN parasitic transistor TX12 with emitter connected to the second voltage source, Vss, the base connected to the second voltage source Vss through a parasitic resistor R12, and the collector connected to the input pad 10. As noted, the active logic circuit input stage entry point is designated by the element A.

Protection device ESD-Vcc 16 is shown as NMOS 16 with drain 16D connected to a first voltage source, Vcc, and source 16S and gate 16G connected to a second voltage source Vss, typically ground. ESD-Vcc device 16 also has parasitic capacitance C16 and diode D16 with cathode connected to the first voltage source Vcc and anode connected to the second voltage source Vss. The capacitance C16 is normally not a degrading factor to circuit performance as it is connected between the power buses. Also shown I the parasitic NPN bipolar transistor TX16 electrically in parallel with NMOS 16. As shown, the TX 16 collector is connected to the first voltage source Vcc, the emitter connected to the second voltage source Vss, and the base connected to the second voltage source Vss through the parasitic resistor R16.

During a positive ESD event at the input pad 10, TX12 collector base junction goes into breakdown turning on TX12 providing a discharge path to Vss. A negative ED event on the input pad 10 is conducted through diode D12 to Vss. If sufficient energy is presented to pull down Vss below normal ground level, TX 16 will turn on providing an additional energy discharge path.

Figure 3:
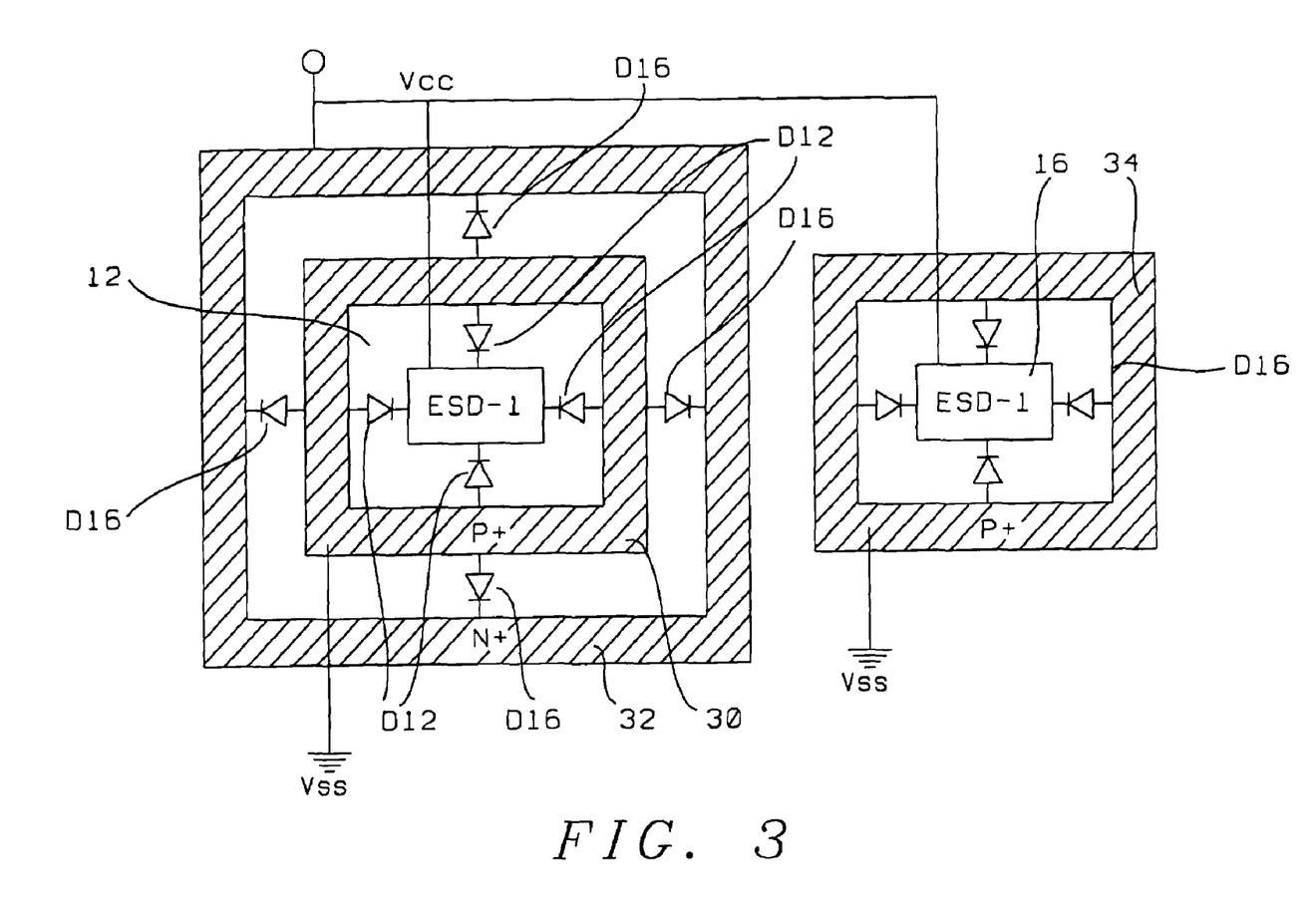
FIG. 3 is a top view representation of the horizontal topography of one embodiment of the invention.

FIG. 3 shows the horizontal topography for the embodiment of the invention. Surrounding the ESD protection device ESD-1 12 is a P+ guard ring 30, which is connected to the second voltage source, Vss, typically ground. This forms the anode of the diode D12, the cathode of which I s connected to the input pad 10 and is a key element for the discharging of negative ESD events with respect to Vss. Another P+ guard ring 34 surrounds the ESD protection device ESD-1 16, which is also connected to the second voltage source, Vss, typically ground. A unique concept of the invention is an N+ doped guard ring 32 that surrounds the P+ guard ring 30. This N+ guard ring 32 forms the anode of diode D16 that is instrumental in providing a discharge path for positive ESD events with respect to Vcc.

Figure 4:
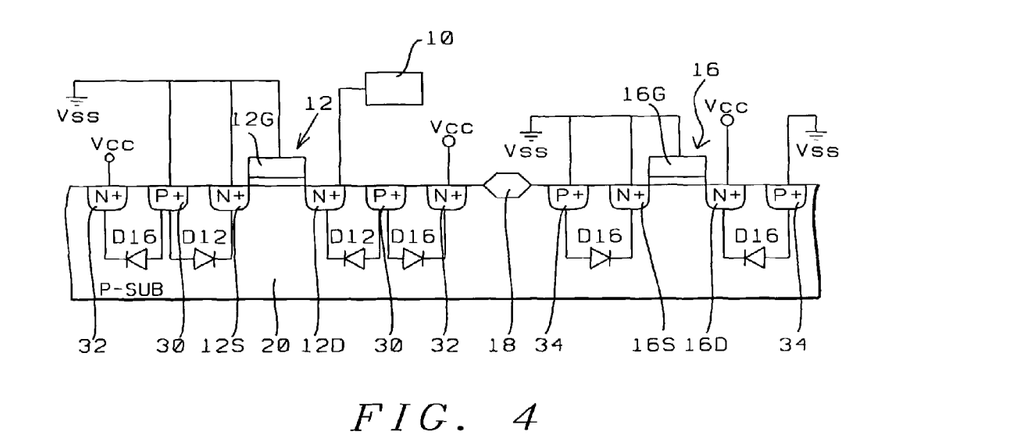
FIG. 4 is a vertical cross section of one embodiment of the invention.

FIG. 4 shows a typical cross section of the embodiment of the invention. ESD-1 which consists of the NFET element 12 with associated parasitic elements, is created upon a P doped substrate 20 with a crystal orientation of <100> and typically doped with an acceptor element such as Boron to a density of between 5E14 and 1E15 atoms per cubic centimeter (a/cm$^3$). After suitable patterning with photoresist (PR), a plurality of N+ and P+regions are created within the substrate. As shown in FIG. 4, two of the N+regions straddle the gate element 12G of the NMOS FET device 12 and form the source 12S and drain 12D which together with the gate element 12G form the NMOS device 12. The N+diffusion regions have a typical donor dopant density of between 1E20 and 1E21 a/cm$^3$. The P+guard ring 30 surrounds NMOS device 12 and is doped with an acceptor dopant to between 1E20 and 1E21 a/cm$^3$. Completing the device structure is the N+ guard ring 32 doped with a donor element to between 1E20 and 1E21a/cm$^3$. As shown in FIG. 4, the P+ guard ring 30, NMOS source 12S, and NMOS 23 gate 12G are connected to the second voltage source Vss, typically ground. The NMOS drain 12D is connected to the input logic line 10. The P+ guard ring 32 is connected to the first voltage source, Vcc. Field oxide (FOX) 18 is used to provide isolation between ESD-1 device 12 and ESD-Vcc device 16.

Figure 5:
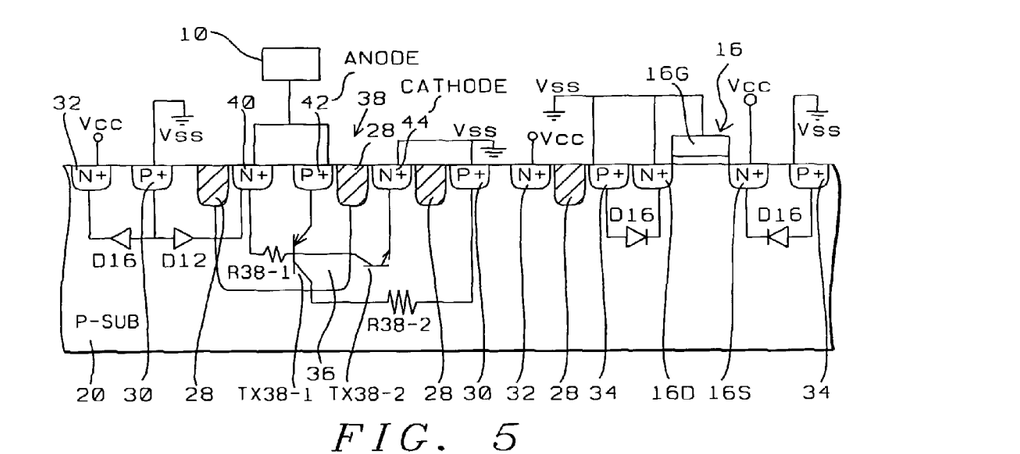
FIG. 5 is a vertical cross section of a second embodiment of the invention.

Another embodiment of the invention is shown in FIG. 5. In this embodiment, a SCR device 38 implements the ESD-1 protection element. An N-well 36 is implanted within the P substrate 20 with a donor element, typically phosphorus, to produce a doping density of between 1E16 and 1E 18a/cm$^3$. Within the N-well 36 are doped regions N+ 40 and P+ 42 that through their electrical contact systems are connected to the logic circuit input line 10. The P+ region 42 forms the anode of a PNPN SCR device which operating method is derived from a vertical PNP bipolar parasitic transistor TX 38-1 and a lateral parasitic NPN bipolar transistor TX 38-2 as is understood in the art.

As indicated in FIG. 5, the P+ region 42 forms the emitter of TX38-1, the base is formed by the N-well 36 and connected back to the input pad through the N-well 36 and the N+ diffused region 40. The resistor R 38-1 is the inherent sheet resistance in the N-well 36. The collector of TX 38-1 is formed by the substrate 20 and connected through the inherent sheet resistor R 38-2 to the P+ guard ring 30 and consequently to a second voltage source typically ground. The N-well 36 forms the collector of the lateral parasitic transistor TX 38-2 to the P+ guard ring and subsequently to the second voltage source Vss typically ground. The emitter of TX38-2 is formed by the N+ region 44, which is electrically connected to the second voltage source Vss, or ground.

The P+ guard ring 30 surrounding the device also serves as substrate contact region, and as previously mentioned, is connected tot he second voltage source, typically ground. The invention embodiment of the N+ guard ring 32 shown in FIG. 5 is connected tot he first voltage source, Vcc. The diode D16 is formed as before between the P+ guard ring 30 and N+ guard ring 32 as well as the ESD-Vcc device P+ guard ring 34 and N+ drain 16S. Diode D12 is formed by the P+ guard ring 30 and the N-well 36 and its associated N+ contact region 40.

As indicated in FIG. 5, the ESD protection device ESD-Vcc 16, is again embodied as an NMOS Fet 16. The drain 16D, gate 16G and P+ guard ring 34 associated with e NMOS device 16 are connected to the second voltage source, Vss, typically ground. The NMOS FET 16 source 16S is connected to the first voltage source, Vcc.

Isolation for the devices is provided by shallow trench isolation elements 28. Diode D12 is formed between the P+ guard ring 30 and ESD-1 device N-well 36 N+ contact 40. The diode D12 provides a discharge path for negative ESD events on the input pad 10 relative to Vss. A positive ESD event relatives to Vss will be discharges through ESD-1 SCR 38 as before. A positive ESD event occurring on the input pad will cause the collector base junction of TX-38-2 to conduct providing positive feedback to turn on TX38-1 until the ESD event expires.

Diode D16 is formed between the SCR device 38 N+ guard ring 32 and the P+ guard ring 30 as well as the ESD-Vcc P+ guard ring 34 and NFET 16 source 16S and drain 16D. A positive ESD event relative to Vcc will turn on ESD-1 SCR 38 as described above, and consequently by discharged through diode D16 to Vcc. A negative ESD event with respect to Vcc will be discharged through diode D12 and the ESD-Vcc NMOS device 16 to Vcc.

Figure 6:
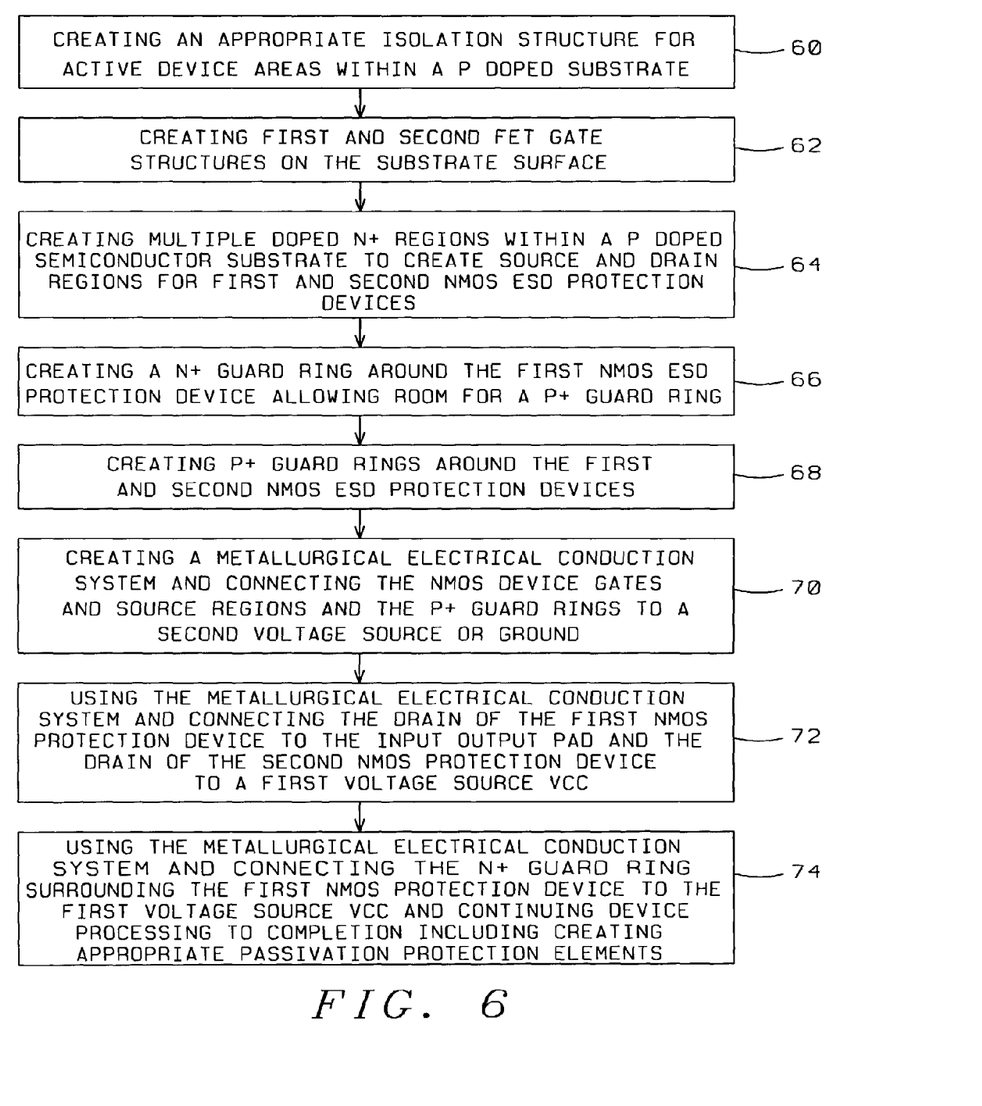
FIG. 6 is a flow chart of the process for the device protection circuit.

FIG. 6 outlines a process for constructing the devices of the invention for the embodiment whereby ESD-1 is a NMOS FET associated parasitic elements and ESD-Vcc is also a NMOS FET device with its associated parasitic elements. As indicated by element 60 in FIG. 6, isolation structures are created within a P doped substrate. The isolation elements can be either thick field oxide, or shallow trench isolation (STI) structures filled with a dielectric such as $SiO_2$. The isolation elements are utilized to define the active device logic area.

First and second gate elements are created from patterning gate oxide and polysilicon layers on the substrate surface as indicated in element 62. FIG. 6 element 64 shows that N+ regions are created after appropriate patterning with well-known methods such as optical masks and photoresist to create source and drain regions that together the gate elements form first and second NMOS ESD protection devices corresponding to ESD-1 and ESD_Vcc. Concurrently with the creation of the N+ source/drain regions, a N+ guard ring is created surrounding the first NFET as indicated in element 66, allowing sufficient room for a P+ guard ring to be inserted between the N+ guard ring and the device itself.

The P+ guard rings are created immediately surrounding the first and second NMOS devices, respectively, as indicated in element 68. These P+ guard rings provide the anode side of the diodes associated with ESD-1 and ESD-Vcc. The N+ guard ring forms the cathode of the diode that shunts negative ESD voltages appearing on Vcc to ground.

Creating a metallurgical electrical conduction system allows the elements to be appropriately connected to the respective circuit nodes. Connecting the drain of the first NMOS ESD-! Protection device to the input-output pad while connecting the source and gate elements as well as the P+ guard rings to a second voltage source Vss, typically ground, initiates the I/O ESD protection circuit. Connecting the drain of the second NMOS ESD-Vcc protection device as well as the N+ guard ring to the first voltage source Vcc, completes the ESD protection circuit. Device processing is continued using conventional techniques such as utilizing a surface passivation layer to provide protection. The surface passivation layer is comprised of borosilicate glass or boron phosphosilicate glass. Processing is continued to completion.

While the invention has been particularly shown and described with reference to the preferred embodiments thereof, it will be understood by those skilled in the art that various changes in form and details may be made without departing from the spirit and scope of the invention.

What is claimed is:

1. A low capacitance device structure with associated parasitic bipolar transistors on a substrate for the purpose of providing four-way electrostatic voltage discharge protection to the active semiconductor devices connected to the I/O logic circuit line and including ESD protection of the power bus system comprising:

a first doped region with contact area of opposite dopant than said substrate;

isolation elements within said substrate;

a first FET gate element upon said substrate surface;

a second doped region within said first doped region of opposite dopant than said first doped region;

a third doped region within said substrate of opposite dopant than said substrate;

a fourth doped region within said substrate of opposite dopant than said substrate;

a fifth doped region within said substrate of opposite dopant than said substrate;

a sixth doped region within said substrate of opposite dopant than said substrate;

a seventh doped region within said substrate of similar dopant to said substrate;

an eighth doped region within said substrate of similar dopant to said substrate;

an electrical connection system for said plurality of doped region and said FET gate;

a surface passivation layer for said ESD protection device, wherein said third doped region forms an N+ guard ring around an SCR device and said fourth doped region forms said SCR cathode and said fifth doped region forms a source region and said sixth doped region forms a drain region, and said source and drain regions adjacent to said first FET gate element to form an NFET device.

2. The structure according to claim 1 wherein said substrate consists of silicon semiconductor material doped with an acceptor element such as boron to a concentration between 1E15 and 1E16 a/cm$^3$.

3. The structure according to claim 1 wherein said first doped region is doped with a donor element such as phosphorus to form an N-well with a dopant concentration of between 1E16 and 1E18 a/cm$^3$.

4. The structure according to claim 1 wherein said isolation elements consist of shallow trench isolation structure or thick field oxide structures.

5. The structure according to claim 1 wherein said first FET gate element is comprised of an oxide insulator and a conductor element such as doped polysilicon.

6. The structure according to claim 1 wherein said second doped region is doped with an acceptor element such as boron to a density between 1E19 and 1E21 a/cm$^3$ and forms the P+ anode terminal of the SCR device.

7. The structure according to claim 1 wherein said third, fourth, fifth and sixth doped regions are doped with a donor dopant such as As to a density of between 1E20 and 1E21 a/cm$^3$ to form N+ regions.

8. The structure according to claim 1 wherein said seventh and eighth doped regions are doped with an acceptor element such as boron to form P+ regions.

9. The structure according to claim 1 wherein said electrical connection system for said first, second, third, fourth, fifth, sixth, seventh and eighth doped regions and said first FET gate element consists of aluminum metallurgy or aluminum doped with 1% silicon metallurgy.

10. The structure according to claim 1 wherein said SCR anode region and said contact region are connected by said conductor system to said I/O logic circuit line.

11. The structure according to claim 1 wherein said N+ guard ring and said NFET source region are connected by said conductor system to a first voltage source, Vcc.

12. The structure according to claim 1 wherein said surface passivation layer is comprised of borosilicate glass or boron phosphosilicate glass.

13. The structure according to claim 1 wherein said seventh doped region forms a first P+ guard ring interposed between said SCR device and said N+ guard ring, and said eighth doped region forms a second P+ guard ring around said NFET.

14. The structure according to claim 13 wherein said first and second P+ guard rings and said SCR cathode and said sixth doped region and said first FET gate element are connected by said conductor system to a second voltage source, typically ground.

* * * * *